(12) United States Patent
George et al.

(10) Patent No.: US 12,310,209 B2
(45) Date of Patent: May 20, 2025

(54) ILLUMINATED-MARKING SYSTEM

(71) Applicant: Flex-N-Gate Advanced Product Development, LLC, Tecumeseh (CA)

(72) Inventors: Ronie George, Kentwood, MI (US); William Dean Hoffman, Dexter, MI (US)

(73) Assignee: Flex-N-Gate Advanced Product Development, LLC, Tecumseh (CA)

( * ) Notice: Subject to any disclaimer, the term of this patent is extended or adjusted under 35 U.S.C. 154(b) by 757 days.

(21) Appl. No.: 17/496,824

(22) Filed: Oct. 8, 2021

(65) Prior Publication Data

US 2022/0115467 A1 Apr. 14, 2022

Related U.S. Application Data

(60) Provisional application No. 63/089,879, filed on Oct. 9, 2020.

(51) Int. Cl.
| | |
|---|---|
| *H10K 59/00* | (2023.01) |
| *F21S 41/141* | (2018.01) |
| *F21S 41/50* | (2018.01) |
| *H10K 59/10* | (2023.01) |
| *H10K 71/00* | (2023.01) |
| *H10K 71/13* | (2023.01) |

(52) U.S. Cl.
CPC .......... *H10K 59/221* (2023.02); *F21S 41/141* (2018.01); *F21S 41/50* (2018.01); *H10K 71/00* (2023.02); *H10K 71/135* (2023.02)

(58) Field of Classification Search
CPC .... H10K 59/221; H10K 71/00; H10K 71/135; F21S 41/141; F21S 41/50
See application file for complete search history.

(56) References Cited

U.S. PATENT DOCUMENTS

| | | | |
|---|---|---|---|
| 6,620,528 B1* | 9/2003 | Yamazaki | H10K 59/221 |
| | | | 313/506 |
| 7,804,418 B2 | 9/2010 | Sullivan et al. | |
| 8,816,586 B2 | 8/2014 | Marcove et al. | |
| 10,023,110 B1* | 7/2018 | Salter | B60Q 1/56 |
| 10,168,039 B2 | 1/2019 | Dellock et al. | |
| 10,400,978 B2 | 9/2019 | Salter et al. | |
| 2002/0178627 A1* | 12/2002 | Tietze | G09F 13/22 |
| | | | 40/205 |

(Continued)

FOREIGN PATENT DOCUMENTS

| | | |
|---|---|---|
| DE | 10311688 A1 | 9/2004 |
| EP | 0880439 A1 | 12/1998 |

(Continued)

OTHER PUBLICATIONS

PCT Patent Application No. PCT/US2021/054080 International Search Report and Written Opinion issued Jan. 13, 2022.

(Continued)

*Primary Examiner* — Gary C Hoge
(74) *Attorney, Agent, or Firm* — Avek IP, LLC

(57) ABSTRACT

An illuminated-marking system for a lamp assembly includes one or more markings illuminated by an organic light emitting diode (OLED) panel. The markings may include an ink composition printed directly onto the OLED panel. A process for printing the ink composition includes printing one or more desired ink compositions onto the OLED panel.

16 Claims, 16 Drawing Sheets

(56) References Cited

U.S. PATENT DOCUMENTS

| | | | |
|---|---|---|---|
| 2006/0017059 A1* | 1/2006 | Strip | H10K 50/841 257/99 |
| 2006/0086020 A1* | 4/2006 | Strip | G09F 13/22 40/544 |
| 2010/0033980 A1* | 2/2010 | Vogel | B60Q 3/46 313/504 |
| 2017/0305572 A1 | 10/2017 | Johnson | |
| 2018/0061285 A1* | 3/2018 | Gilbert | G09F 15/005 |
| 2018/0179712 A1* | 6/2018 | Mangialardi | G09F 13/16 |
| 2019/0165057 A1 | 5/2019 | Lee | |
| 2019/0236866 A1* | 8/2019 | Leonard | G07C 9/253 |
| 2020/0083305 A1* | 3/2020 | Chung | H10K 77/111 |
| 2024/0235847 A1* | 7/2024 | Jacobson | H04L 9/3247 |

FOREIGN PATENT DOCUMENTS

| | | |
|---|---|---|
| JP | 2019040855 A | 3/2019 |
| RU | 2401703 C2 | 10/2010 |

OTHER PUBLICATIONS

Extended European Search Report issued Mar. 19, 2024 in EP Publication No. 4225612.

* cited by examiner

ILLUMINATED-MARKING SYSTEM

CROSS-REFERENCE TO RELATED APPLICATIONS

This application claims the benefit of U.S. Provisional Patent Application No. 63/089,879 entitled "Illuminated-Marking System" and filed on Oct. 9, 2020, which is herein incorporated by reference in its entirety.

BACKGROUND OF THE INVENTION

1. Field

The disclosed embodiments relate generally to the field of lighting devices. More specifically, the disclosed embodiments relate to printed graphics on light sources for providing custom vehicle lighting displays.

2. Description of the Related Art

Illuminated markers or emblems for vehicles are known in the art. U.S. Pat. No. 7,804,418 to Sullivan et al. discloses a light assembly for a vehicle that includes a lens having one or more ink markings. U.S. Pat. No. 10,400,978 to Salter et al. discloses a vehicle light assembly comprising LEDs housed in semiconductor ink. U.S. Pat. No. 10,168,039 to Dellock et al. discloses a vehicular badge which illuminates an indicia or marking by means of a lighting source. U.S. Pat. No. 8,816,586 to Marcove et al. discloses an illuminated device which may be attached to a vehicle to display an emblem.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the invention will be apparent from the following detailed description of the embodiments and the accompanying drawing figures.

In an embodiment, an illuminated-marking system is provided. The system includes an OLED panel integrated within a lighting assembly and a custom marking disposed on a surface of the OLED panel for blocking a portion of light emitted from the OLED panel, thereby forming a custom marking within the exterior of the lighting assembly. The custom marking may be an ink composition. The ink composition may be printed directly onto the OLED panel. The custom marking may have a blocked portion for blocking light and an unblocked portion for allowing light to pass, thereby forming an illuminated emblem. The custom marking may further have a border marking disposed on the OLED panel. The blocked portion may be a semi-opaque emblem. The custom marking may be formed by one or more layers of ink composition. The OLED panel may include a backing that increases the efficiency of light emitted by the OLED panel. The lighting assembly may be a vehicular light assembly.

In an embodiment, an illuminated-marking system in a vehicle light assembly is provided. The system includes and OLED panel integrated within the vehicle lighting assembly, and a first marking which is printed on the OLED panel and alters light exiting the OLED panel. The first marking may be an ink composition. The first marking may allow light to pass through a first portion thereby forming an illuminated emblem. The first marking may block light at a first portion thereby forming an opaque emblem. The system may include a border marking portion adjacent to the first marking. The OLED panel may have a backing that increases the efficiency of light emitted from the OLED panel.

In an embodiment, a process for producing an illuminated-marking system in a vehicle lighting assembly is provided. The process includes mixing one or more inks to form a desired ink composition; printing the ink composition onto an OLED panel; curing the ink composition on the OLED panel to form the illuminated-marking system; and integrating the illuminated-marking system within the vehicle lighting assembly. The process may include printing an adhesion promotor onto the OLED panel prior to printing the ink composition onto the OLED panel. Curing of the ink composition may include exposing the ink composition to ultraviolet light. The mixing of the one or more inks may provide an ink composition that is substantially opaque. The mixing of the one or more inks may provide an ink composition that is substantially translucent.

BRIEF DESCRIPTION OF THE SEVERAL VIEWS OF THE DRAWINGS

Illustrative embodiments are described in detail below with reference to the attached drawing figures, which are incorporated by reference herein and wherein.

Figure 1:
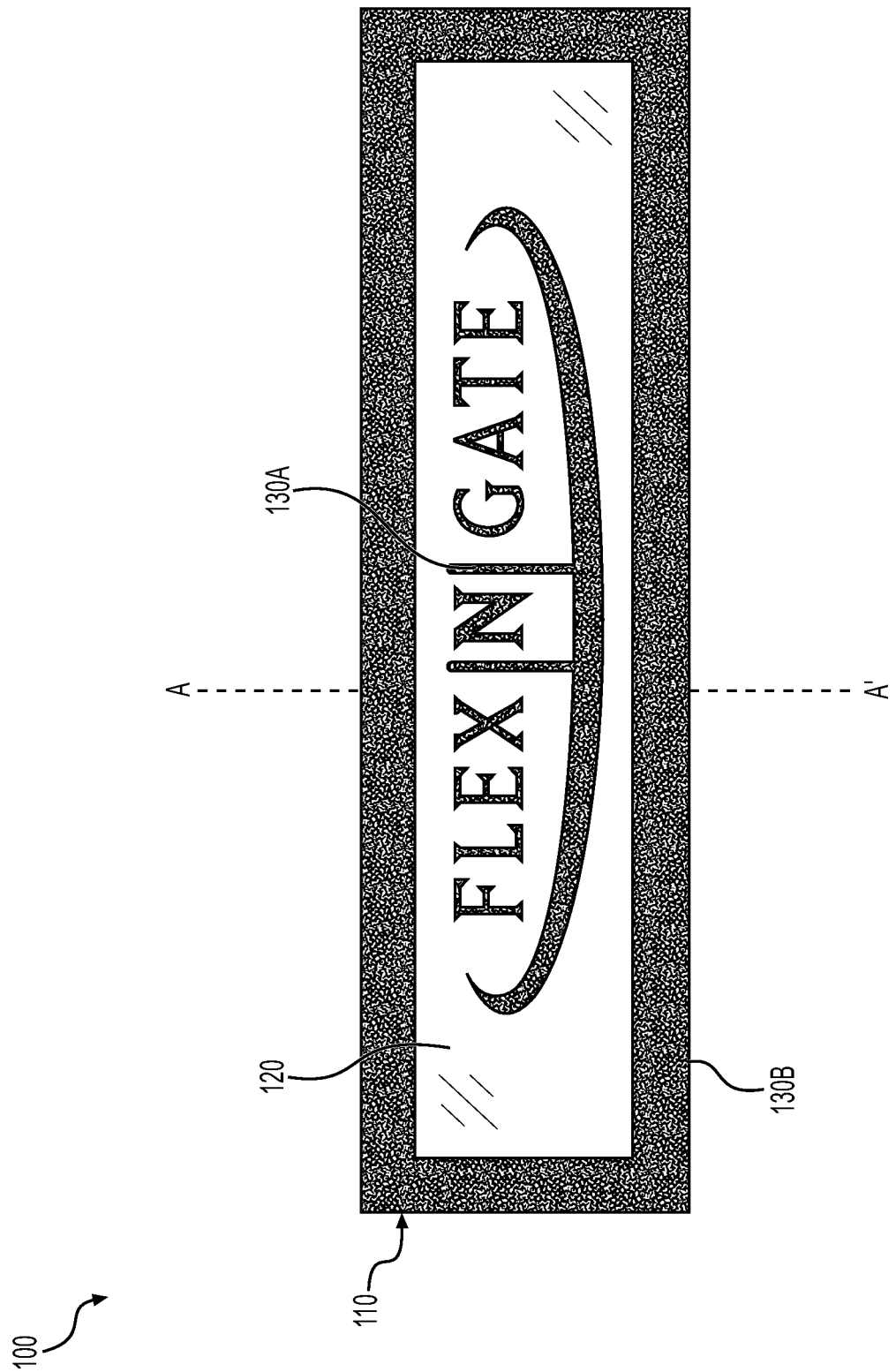
FIG. 1 shows an illuminated-marking system, in an embodiment.

The drawing figures do not limit the invention to the specific embodiments disclosed and described herein. The drawings are not necessarily to scale, emphasis instead being placed upon clearly illustrating the principles of the invention.

DETAILED DESCRIPTION

The following detailed description references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the invention. The following detailed description is, therefore, not to be taken in a limiting sense. The scope of the invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the technology can include a variety of combinations and/or integrations of the embodiments described herein.

Disclosed are lighting systems that incorporate markings disposed onto a surface of a lighting element. In certain embodiments, the lighting element is a light emitting panel that produces a homogenous light output, such as an organic light emitting diode (OLED) panel. OLED panels are light emitting panels made from organic (carbon based) materials that emit light when electricity is applied. An OLED panel includes a thin film of material that emits light evenly across the entire panel. OLED panels may be flexible, enabling their use to form curved lighting elements. OLED panels may be substantially transparent when unlit, enabling their use as an overlay over another feature or lighting element such that the underlying feature or lighting element is partially visible through the unlit OLED panel. OLED panels may be configured to emit different colors of light. Alternative lighting technologies may be employed for providing a light emitting panel having a homogenous light output without departing from the scope hereof.

Embodiments of the present disclosure incorporate one or more markings applied to a portion of an OLED panel to block, partially or completely, a corresponding portion of emitted light. Embodiments disclosed herein enable the customization of the OLED panel for different automotive lighting requirements by modifying the OLED panel with custom markings. The custom markings may be applied directly to the OLED panel resulting in an illuminated marking. The marking may be varied for different design requirements and applied to the same type of OLED panel to produce different illuminated markings. In this manner, an OLED panel having a standard size, shape, and luminosity may be implemented on different vehicles, while custom markings are applied in a post-process to the OLED panels for differentiating the illuminated appearance of the OLED panel among the different vehicles. The custom markings may include printed sections that block light, partially or completely, for altering the size, shape, and/or luminosity of the illuminated portion of the OLED panel, thus altering the appearance of the size, shape, and/or luminosity of the illuminated marking.

In certain lighting applications, a marking may be incorporated into a light assembly for producing a desired visual effect and/or for branding purposes. The marking may include but is not limited to any combination of graphics, images, logos, patterns, emblems, symbols, signs, shapes, or text.

Traditionally, markings for lighting assemblies are formed directly into the substrate of a lighting element. For example, an outer lens of a lighting assembly may include a marking formed in the plastic material of the outer lens. However, these types of direct markings require that the marking be imprinted in a mold that is used to form the lens. Therefore, changes to the marking require a new mold for incorporation into the lens, making the implementation of custom markings into various lighting assemblies expensive and time consuming.

FIG. 1 shows an exemplary illuminated-marking system 100 having an OLED panel 110 adapted for displaying a first marking 130A. First marking 130A is adapted to block light, partially or completely, emitted from the underlying OLED panel 110. First marking 130A may be a decal fixed to OLED panel 110, or first marking 130A may be printed onto OLED panel 110. Different types of prints may be used, such as a screen print, pad print, ink-jet print or other type of print, as further described below.

An unblocked portion 120 of OLED panel 110 emits light when illuminated-marking system 100 is in a lit state (e.g., when OLED panel 110 is turned on). In other words, unblocked portion 120 becomes the illuminated portion when OLED panel 110 is in the lit state. In an unlit state (e.g., when OLED panel 110 is turned off), the markings remain visible due to the visible contrast between the marking material and the top surface of the OLED panel 110. The unlit appearance of OLED panel 110 itself may be clear, reflective, or it may have a dull matte finish in different embodiments. For a clear OLED panel 110, unblocked portion 120 is substantially transparent enabling a view through system 100 at unblocked portion 120. For a reflective OLED 110, unblocked portion 120 acts as a mirror with around 20-40% specular reflection. In other words, unblocked portion 120 of a reflective OLED 110 provides a reflection with the same resolution as a mirror but only 20% to 40% of the total reflectivity compared to a mirror. For a dull matte OLED 110, unblocked portion 120 appears milky white and is not reflective but instead appears diffuse.

In the embodiment depicted in FIG. 1, a border marking 130B provides a blocked portion around the periphery of OLED panel 110. The border marking 130B of OLED 110 may include a non-active area used for handling and/or connecting electrical components, and this region may be hidden from border marking 130B. Also, as depicted in the embodiment of FIG. 1, first marking 130A and border marking 130B are adapted to completely occlude passage of light from the underlying OLED panel 110. Of course, additional markings of varying opacity may be provided on OLED panel 110 without departing from the scope hereof.

Figure 2:
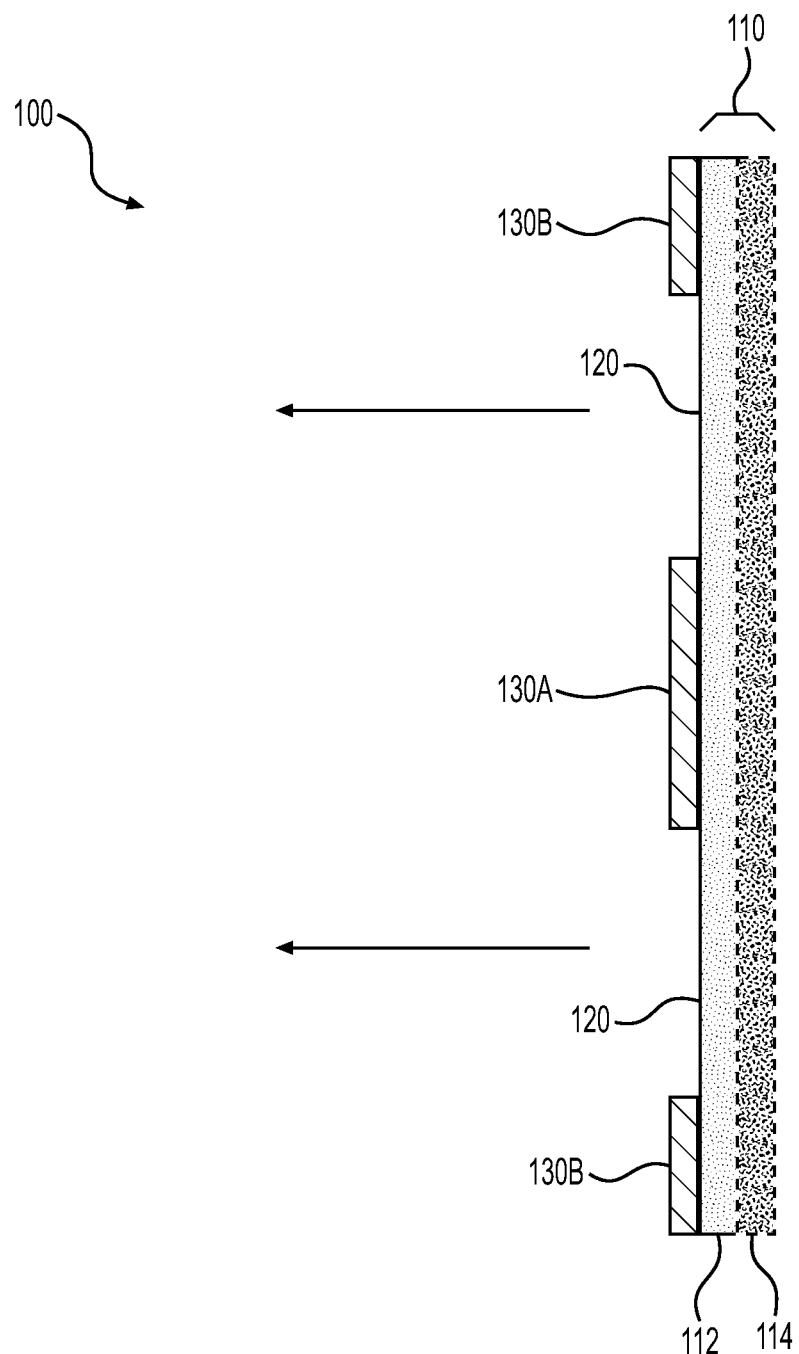
FIG. 2 shows a cross-sectional side view of the illuminated-marking system of FIG. 1, in an embodiment.

FIG. 2 shows a cross-sectional side view of illuminated-marking system 100 along the A-A' line indicated in FIG. 1. First marking 130A and border marking 130B prevent emission of light from OLED panel 110, whereas unblocked portions 120 emit light when OLED panel 110 is in the lit state, as indicated in FIG. 2 with arrows.

As depicted in FIG. 2, OLED panel 110 includes a transparent layer 112 and may include a backing 114. For embodiments having a clear OLED panel 110, no backing exists such that the OLED panel 110 is substantially transparent in the unlit state. However, an OLED without a backing has less efficiency for emitting light in the lit state. For embodiments having a reflective or dull matte OLED 110, backing 114 may be included to increase the efficiency of emitted light in the lit state. Backing 114 may be, for example, an aluminum sheet or panel, mylar, acrylic mirror, glass mirror, or astro-foil.

To provide a desired visual effect, a marking (e.g., first marking 130A) may be arranged in an image set. For example, the image set may be used to create a pattern of light blocking. The image set may include a series of images layered on top of one another. In certain embodiments, the image set is provided on a plurality of media, which may be layered upon one another to form a stackup of images. The image set may be transferred onto OLED panel 110 via any suitable method such as pad printing, described below. In some embodiments, such as FIG. 3, the plurality of media comprise a plurality of printed decals such that the plurality of printed decals are layered on top of one another on the surface of OLED panel 110 to create the image set. For example, a second marking 131A and a second border marking 131B may be disposed directly onto the first marking 130A and the border marking 130B. In some embodiments, the subsequent layers, such as the second marking 131A and second border marking 131B, may be disposed such that they substantially overlay the first marking 130A and border marking 130B. In some embodiments, the subsequent layers, such as the second marking 131A and second border marking 131B, may be disposed slightly offset from the first marking 130A and border marking 130B, therein forming a visual effect different than those of other embodiments in which the second markings 131 directly overlay the first markings 130. In some embodiments, the composition of the second marking 131A and the second border marking 131B is similar to the composition of the first marking 130A and border marking 130B. In some embodiments, the composition of the second marking 131A and the second border marking 131B is different than the composition of the first marking 130A and border marking 130B. This layering process may be repeated to stack any number of layers to create a desired effect.

An exemplary process for applying ink in a predetermined pattern is pad printing. U.S. Pat. No. 7,804,418 to Sullivan et al., the disclosure of which is hereby incorporated by reference in its entirety, provides an exemplary pad printing process for applying markings to lighting assemblies. In embodiments, pad printing is used to transfer an image set onto a light transferring medium. However, other methods of providing ink on a lighting element may be used without departing from the scope hereof. For example, ink may be provided by coating, painting, spraying, airbrushing, screen printing, hydrographic printing, ink jet printing, lithography, holography, static image transfer, or any other suitable method.

In certain embodiments, the markings are formed using a material (e.g., an ink) that appears generally or substantially opaque (e.g., with substantially no light visible through the marking). However, in some embodiments, the markings are formed using a material (e.g., an ink) that appears translucent such that when backlit by OLED panel 110, at least a portion of the light emitted from OLED panel 110 passes through the marking. The markings may be adapted to provide different degrees of opacity such that different amounts of light pass through the markings. In other words, the markings may be opaque, semi-opaque, translucent, semi-transparent or transparent. Additionally, the markings may include a plurality of portions having differing levels of opacity. Distinct or common decorative patterns may be disposed on some or all of the plurality of portions. It is contemplated that numerous portions of OLED panel 110 may be printed using a variety of degrees of opacity in order to accomplish vehicle exterior design objectives.

In some embodiments, the markings may be provided on OLED panel 110 using a specially formulated ink that is intended to appear substantially opaque until it is backlit by OLED panel 110, at which point the marking becomes at least partially translucent or transparent to allow at least a portion of the light from OLED panel 110 to pass through the marking.

Figure 3:
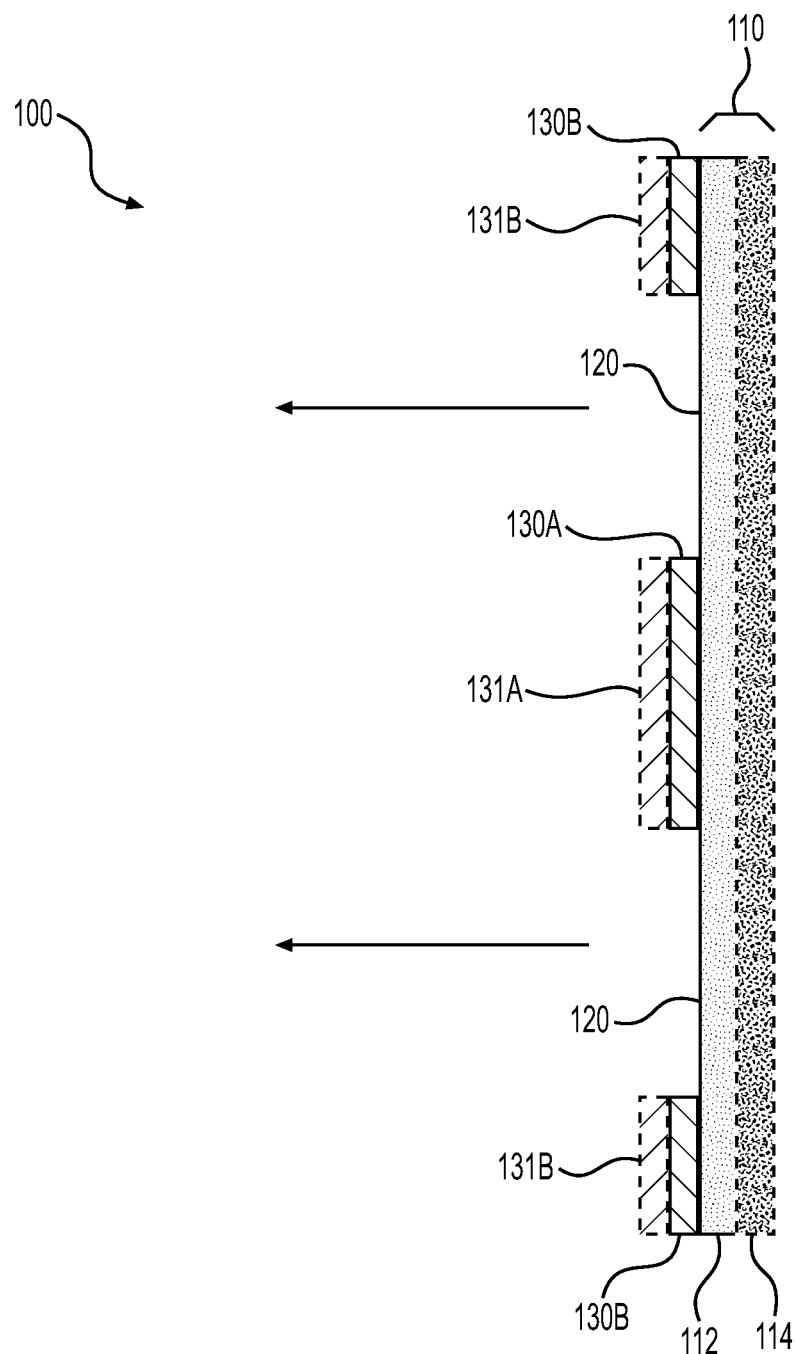
FIG. 3 shows a cross-sectional side view of the illuminated-marking system of FIG. 1, in an embodiment.

The amount of light passing through the marking will depend on a number of factors, including the composition of the ink and the characteristics (e.g., intensity, color, etc.) of OLED panel 110, which may be varied to obtain the desired effect according to various exemplary embodiments. For example, by varying the ratio of the transparent and pigmented (i.e., colored) components used to prepare the ink, the amount of light that may pass through the marking may be varied. For example, the ink may be configured to provide semitransparent markings on OLED panel 110. Semitransparent paints or inks may be applied in one or more layers for providing different colors and/or different levels of transparency, such as shown in FIG. 3.

Different colored inks may also interact differently with light such that the amount of light allowed through the marking may vary. In embodiments, different transparencies or translucencies may be obtained by mixing transparent or translucent inks with pigmented inks in various proportions. By modulating the density of the ink applied, advantageous visual effects are provided, such as shadowing and/or creating a perception of depth. In certain embodiments, the print may be adapted to filter light from OLED panel 110 thereby permitting light within a certain range of wavelengths to pass. For example, OLED panel 110 may provide a homogenous white light while the print may be configured to emit only a certain color.

In some embodiments, the ink may be of a chromatic composition, which may, for example, provide a reflective visual effect for an individual viewing the OLED panel 110. In one embodiment, the chromatic ink may be printed to provide a highlighted effect wherein a duller chromatic ink is printed adjacent to a brighter chromatic ink. In one embodiment, the chromatic ink may be printed to provide a shadow effect, wherein a nonchromatic, partially transparent, ink is printed around a chromatic ink. This shadow effect may provide a three-dimensional effect for an individual viewing the OLED panel 110.

In some embodiments, layering of the markings may be used to create a textured appearance. Here, the plurality of layers may not directly overlay on top of the lower layers and the ink may be partially transparent. For example, the first marking 130A may comprise a substantially triangular pattern and may not completely fill the depth of the area printed on. The second marking 131A may comprise a substantially square pattern and similarly may not completely fill the depth of the area printed on. This printing technique may provide a textured appearance. It is contemplated that any number of textures may be printed and layered on top of one another to create a desired textual appearance.

Portions of OLED panel 110 may be omitted to produce unblocked portions. For example, in FIGS. 1, 2, and 3, unblocked portions 120 lack light blocking material such that those portions are fully illuminated when OLED panel 110 is in the lit state.

The printing process used may be an inkjet printing process. More specifically, a flatbed or other type of printer may be used. Alternatively, the printing may be done using a multi-axis robotic system (e.g., the inkjet head may be mounted on a robotic arm). This robotic system may be used to print onto non-flat (e.g., three-dimensional surfaces) if desired. In this system, the flatbed-type printer involves the placement of the OLED panel 110 on a supporting surface, and one or more print heads deposit ink onto OLED panel 110 from above. In some embodiments, the printed matter may be instantaneously dried using ultraviolet light (UV) during the printing process. Further, some printing units also enable the deposition of protective coatings atop the ink once deposited.

Alternatively, a lithographic (litho) press, digital press, or other system enabling printing onto OLED panel 110 may be used. Additionally, the ink selected for use may be fade resistant for withstanding exposure to direct or indirect sunlight.

In some embodiments, an adhesion promoting material for UV curable inks is applied. For example, in embodiments either: (i) APPL adhesion promotor of the Prodigy line of products available from INX International Ink Co., located in Schaumburg, IL; (ii) AP3155 available from Supply 55, Inc. located in Ann Arbor, Michigan; or (iii) any number of other substantially equivalent products may be used. The adhesion promotor is applied onto the top side of OLED panel 110 for the purpose of preparing the substrate for receipt of the ink. More specifically, a lint free or microfiber cloth may be saturated with the adhesion promoter and applied to areas of the OLED panel 110 surface on which the printing is to be done. Next, another lint free or microfiber cloth is used to wipe the OLED panel 110 surface and leave an evenly thin layer on which the ink will be received. It should be noted that in embodiments the application of adhesion promoting material is optional, and a direct application of ink may be made.

An inkjet printer may be used to deposit a first layer of ink upon the adhesion promoting material that has already been applied onto the top side of the OLED panel 110 surface. In embodiments, the ink may be UV curable such that the layer of ink is then cured using UV light. The ink and the adhesion promotor may be adapted to cure together. Numerous different UV curable ink compositions may be used so long as the ink is compatible for digital inkjet printing.

In some embodiments, a sequence of additional layers of ink are gradually built up on top of the first layer with each layer being subsequently cured after its application using the UV light. This results in growth of the ink layers above the OLED panel 110 surface for providing a unique visual characteristic.

Control of illuminated-marking system 100 may be manual or automated. For example, one or more buttons or switches may be located in a vehicle cabin such that illuminated-marking system 100 is capable of being manually controlled. Alternatively, the illuminated-marking system 100 may be automated via a control system, such as control system 300 described below in connection with FIG. 4.

Figure 4:
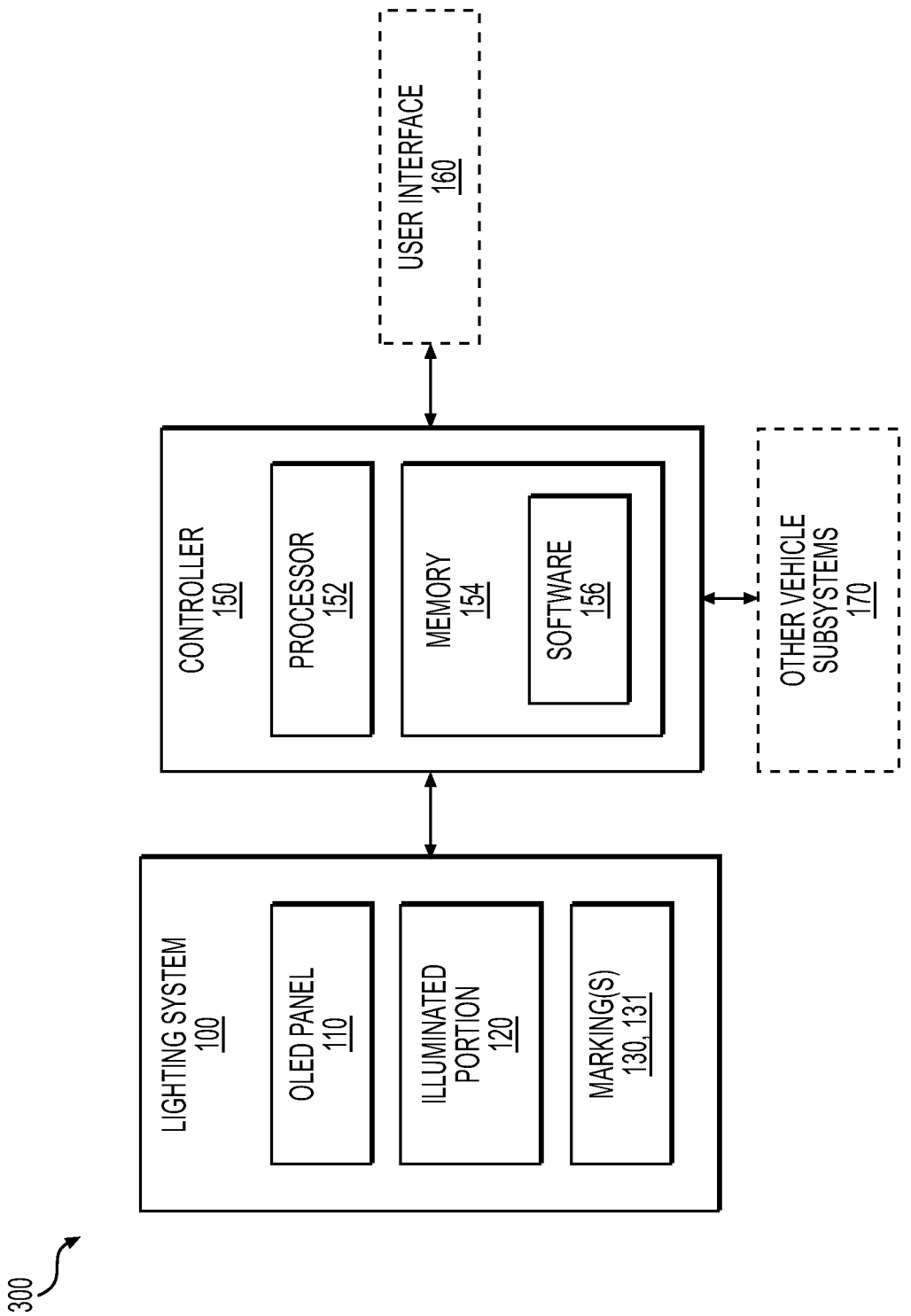
FIG. 4 is a block diagram showing components of an exemplary control system for controlling the illuminated-marking system of FIG. 1, in an embodiment.
Figure 5:
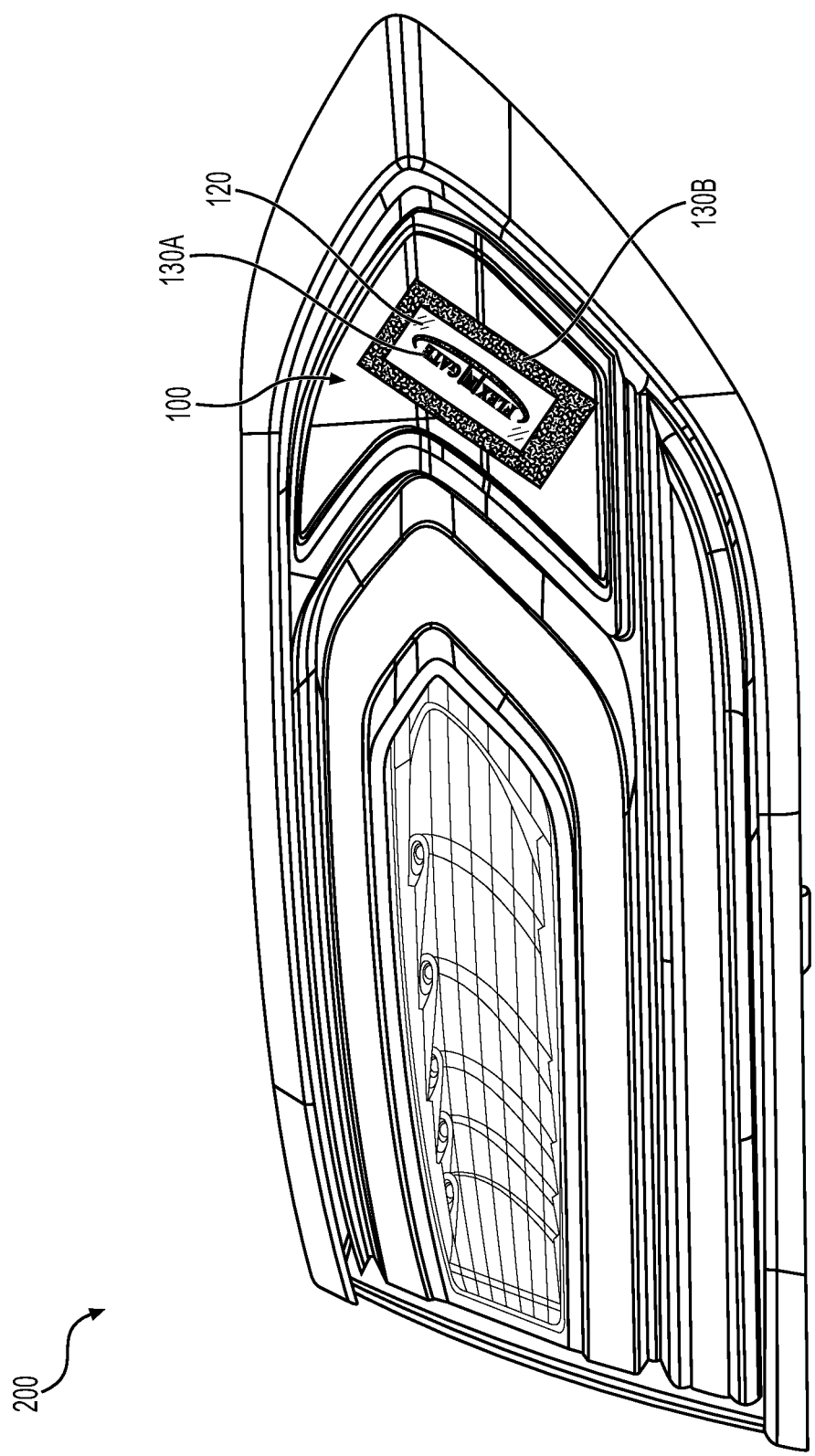
FIG. 5 depicts one embodiment of an illuminated-marking system incorporated in a vehicle headlight assembly.
Figure 6:
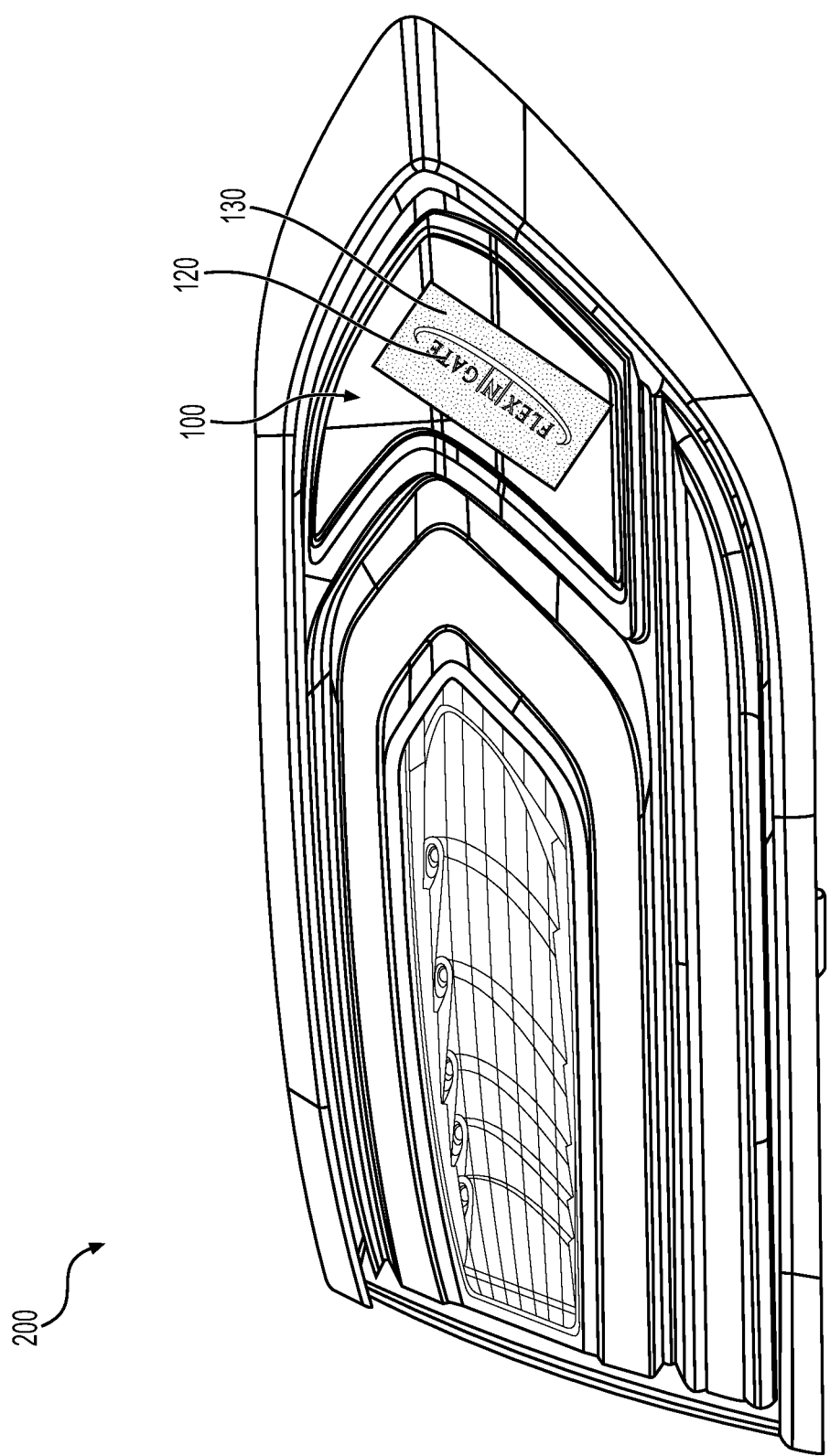
FIG. 6 depicts another embodiment of an illuminated-marking system incorporated in a vehicle headlight assembly.
Figure 7:
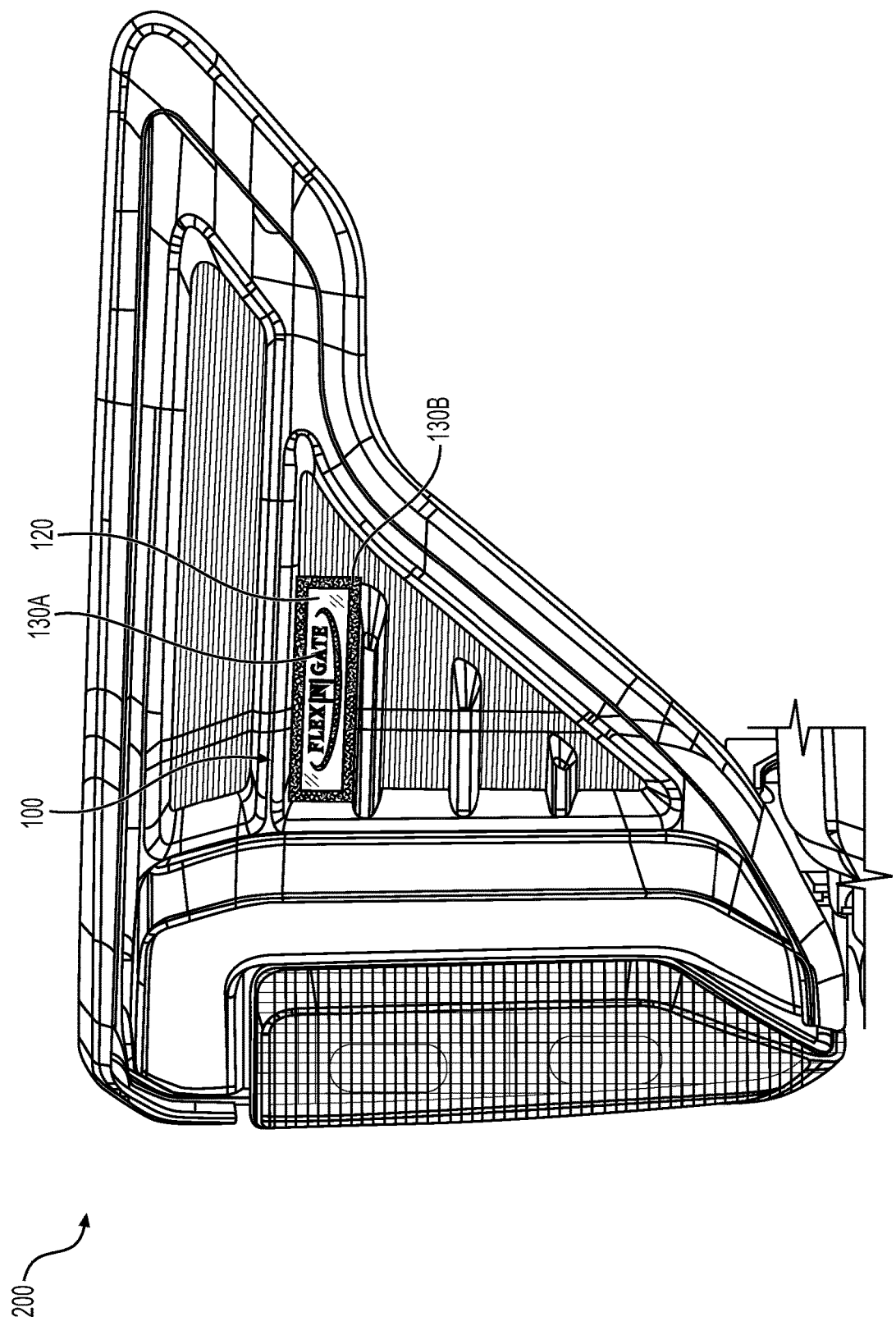
FIG. 7 depicts another embodiment of an illuminated-marking system incorporated in a vehicle headlight assembly.
Figure 8:
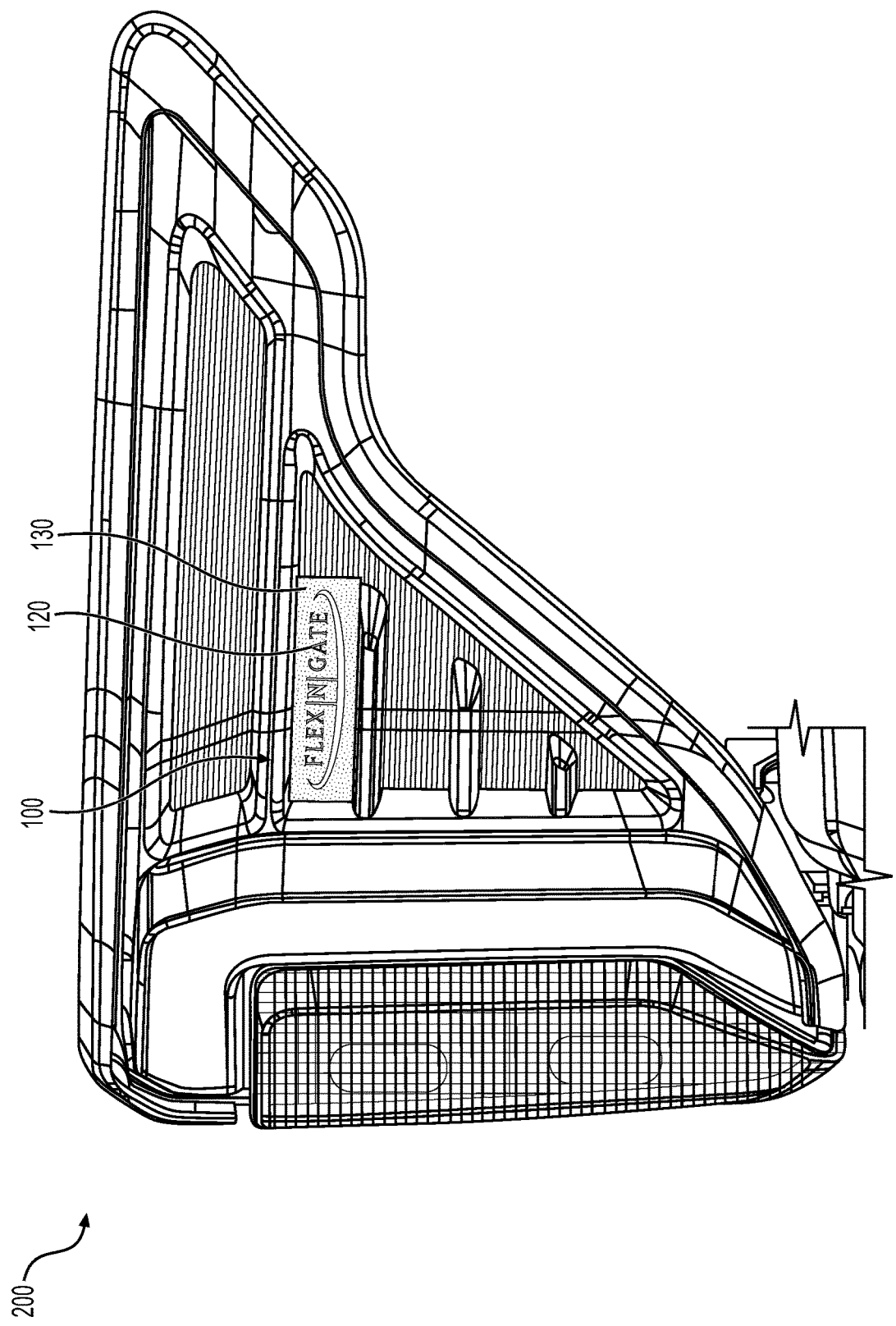
FIG. 8 depicts another embodiment of an illuminated-marking system incorporated in a vehicle headlight assembly.
Figure 9:
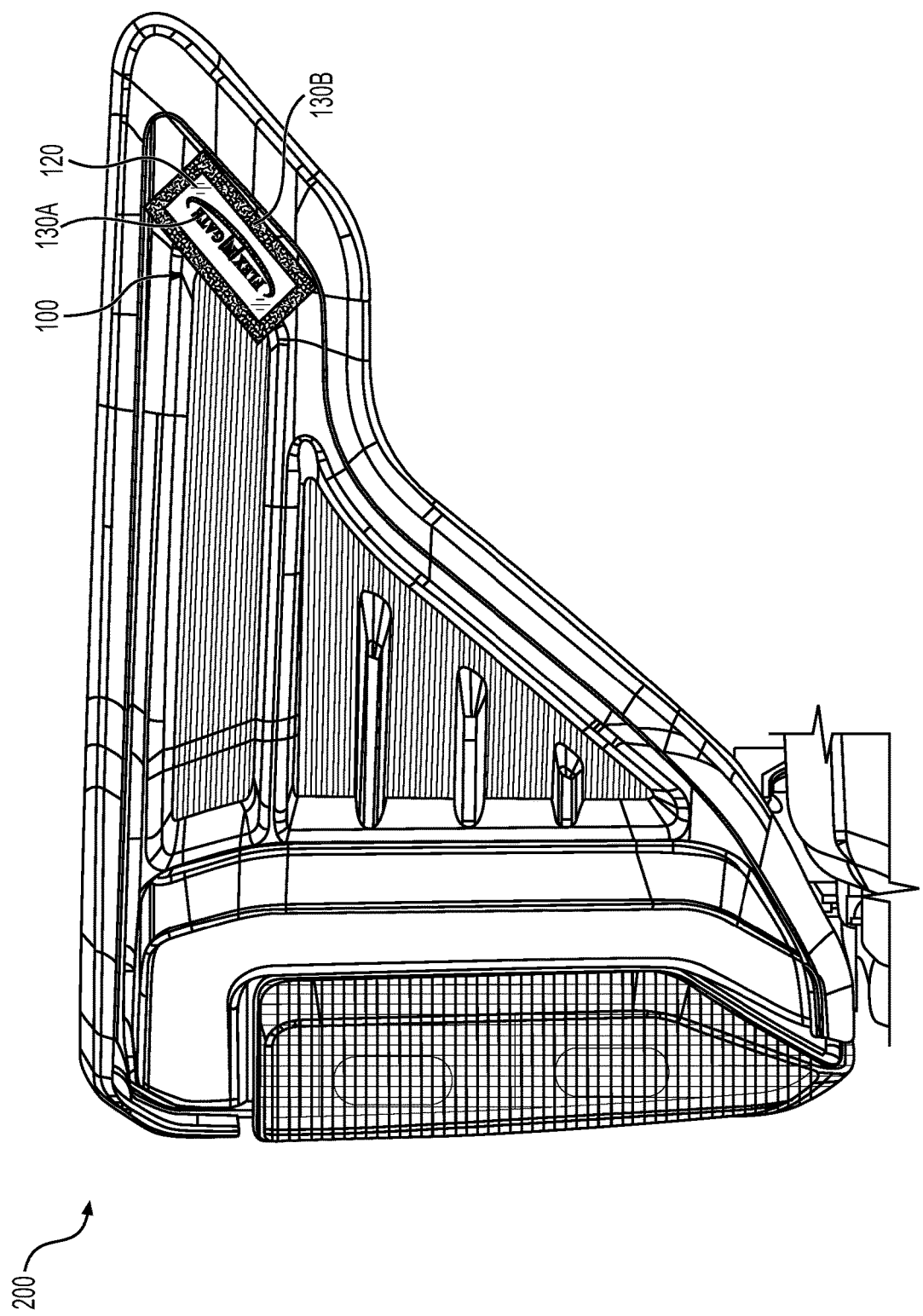
FIG. 9 depicts another embodiment of an illuminated-marking system incorporated in a vehicle headlight assembly.
Figure 10:
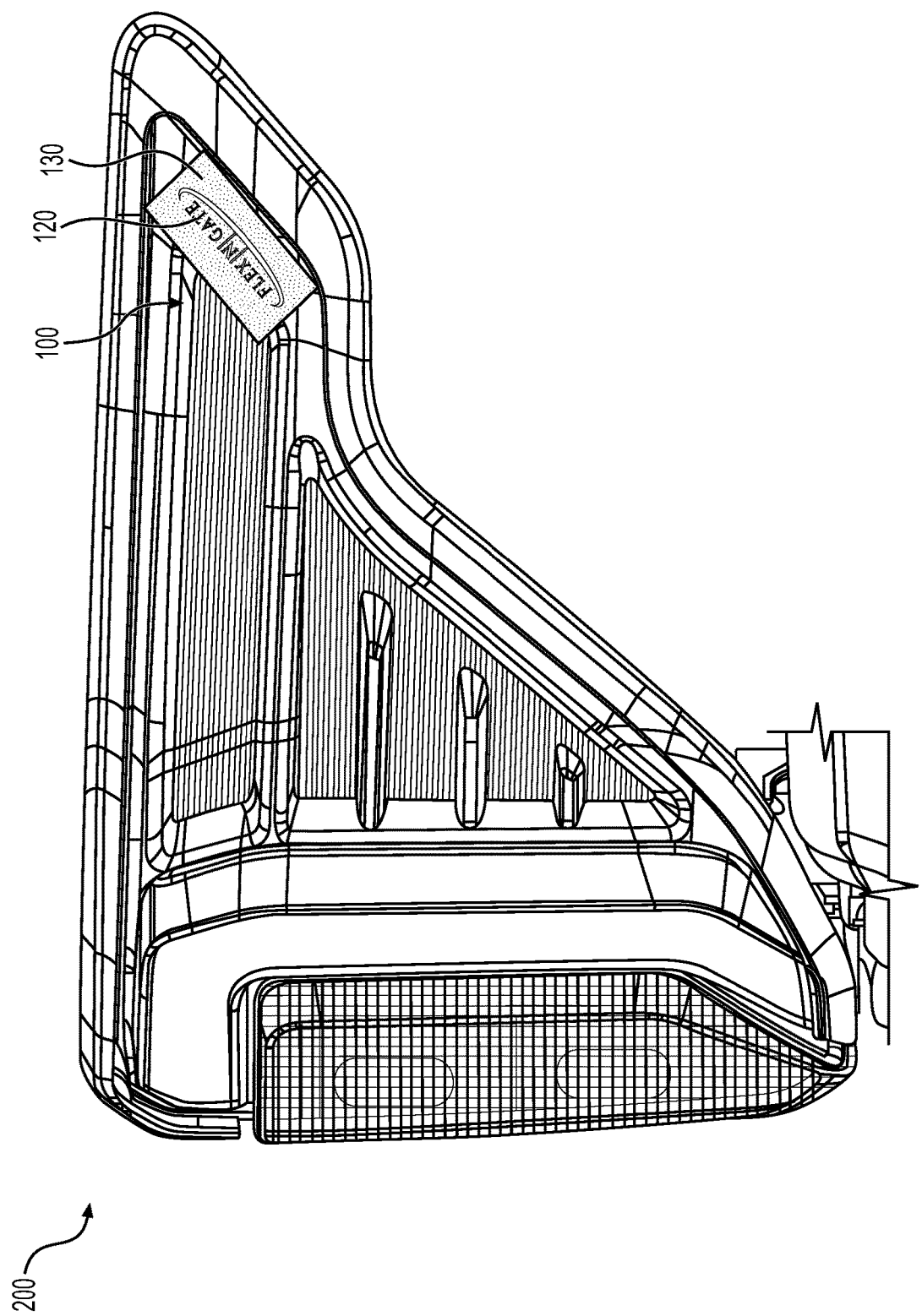
FIG. 10 depicts another embodiment of an illuminated-marking system incorporated in a vehicle headlight assembly.

FIG. 4 is a block diagram showing components of an exemplary control system 300 for controlling illuminated-marking system 100. Control system 300 includes a controller 150, which is for example a computer, microcontroller, microprocessor, or programmable logic controller (PLC) having a memory 154, including a non-transitory medium for storing software 156, and a processor 152 for executing instructions of software 156. The controller 150 is not limited by the materials from which it is formed, or the processing mechanisms employed therein and, as such, may be implemented via semiconductor(s) and/or transistors (e.g., electronic integrated circuits (ICs)), and so forth.

An optional user interface 160 enables a user to transmit inputs and receive outputs. In certain embodiments, user interface 160 includes one or more buttons or switches located in a vehicle cabin such that illuminated-marking system 100 may be manually controlled. In some embodiments, user interface 160 includes a touch screen display device configured for receiving touch indications by the user. The touch screen display device may be located in the vehicle cabin and/or accessed remotely via a mobile device (e.g., smartphone, tablet, or laptop computer). User interface 160 accepts input commands (e.g., to turn on/off one or more illuminated-marking systems 100 located on the vehicle) and displays information about the one or more illuminated-marking systems 100 (e.g., a status indicator that indicates whether the one or more illuminated-marking systems 100 are in an active or inactive state).

In certain embodiments, controller 150 is optionally coupled communicatively with other vehicle subsystems 170. This enables automatic illumination of OLED panel 110. For example, when a user unlocks the vehicle doors via a key fob, OLED panel 110 may be turned on to illuminate a marking 130. For an embodiment of a taillight assembly having illuminated-marking system 100 integrated therein, when a user depresses the vehicle brakes, OLED panel 110 may be illuminated in coordination with a brake light.

Communication between user interface 160, controller 150, other vehicle subsystems 170, and illuminated-marking system 100 may be by a wired and/or wireless communication media. For example, controller 150 may include a transmitter/receiver, a multi-channel input/output (I/O) data bus, or the like (not shown) for communicatively coupling with user interface 160 and illuminated-marking system 100.

Control system 300 provides control of illuminated-marking system 100, which may be independent of, and/or coupled with illumination of another vehicle light source. For example, an illuminated-marking system 100 coupled with a headlight assembly may be turned on whenever the daytime running light (DRL) function is active.

Control system 300 may be programmed to provide animation (e.g., blinking) of OLED panel 110, and different animation schemes may be selectable via user interface 160.

In operation, light emitted from OLED panel 110 illuminates unblocked portions 120 of OLED panel 110. Portions containing markings (e.g., first marking 130A and border marking 130B), may appear unlit or partially lit depending on the type of ink employed. For example, an image set having a semi-transparent light blocking material may be adapted to glow with moderate intensity while unblocked portions 120 are highlighted by brighter (e.g., unfiltered) light. In another example, the light blocking material is opaque and of a dark color (e.g., black) so as to provide maximum contrast with unblocked portions 120.

Illuminated-marking system 100 may be used to prevent light transfer or allow partial light transfer to provide unique lit appearances, intensity, and color variations. In some embodiments, a vehicle lamp assembly with illuminated-marking system 100 is adapted for providing vehicle lamp legal functions, welcome functions, autonomous driving signaling, and/or logo functions using static and/or dynamic effects. The intensity and color variations that are projected may be used with static and/or dynamic effect based on whether the vehicle is parked or moving. The color and intensity of light emitted may be subject to domestic and international vehicle lamp regulations for legal portions of the lamp assemblies, which may affect design of the light assemblies. For example, vehicle brake light assemblies must provide a specific total illumination surface area and illumination intensity.

Figure 11:
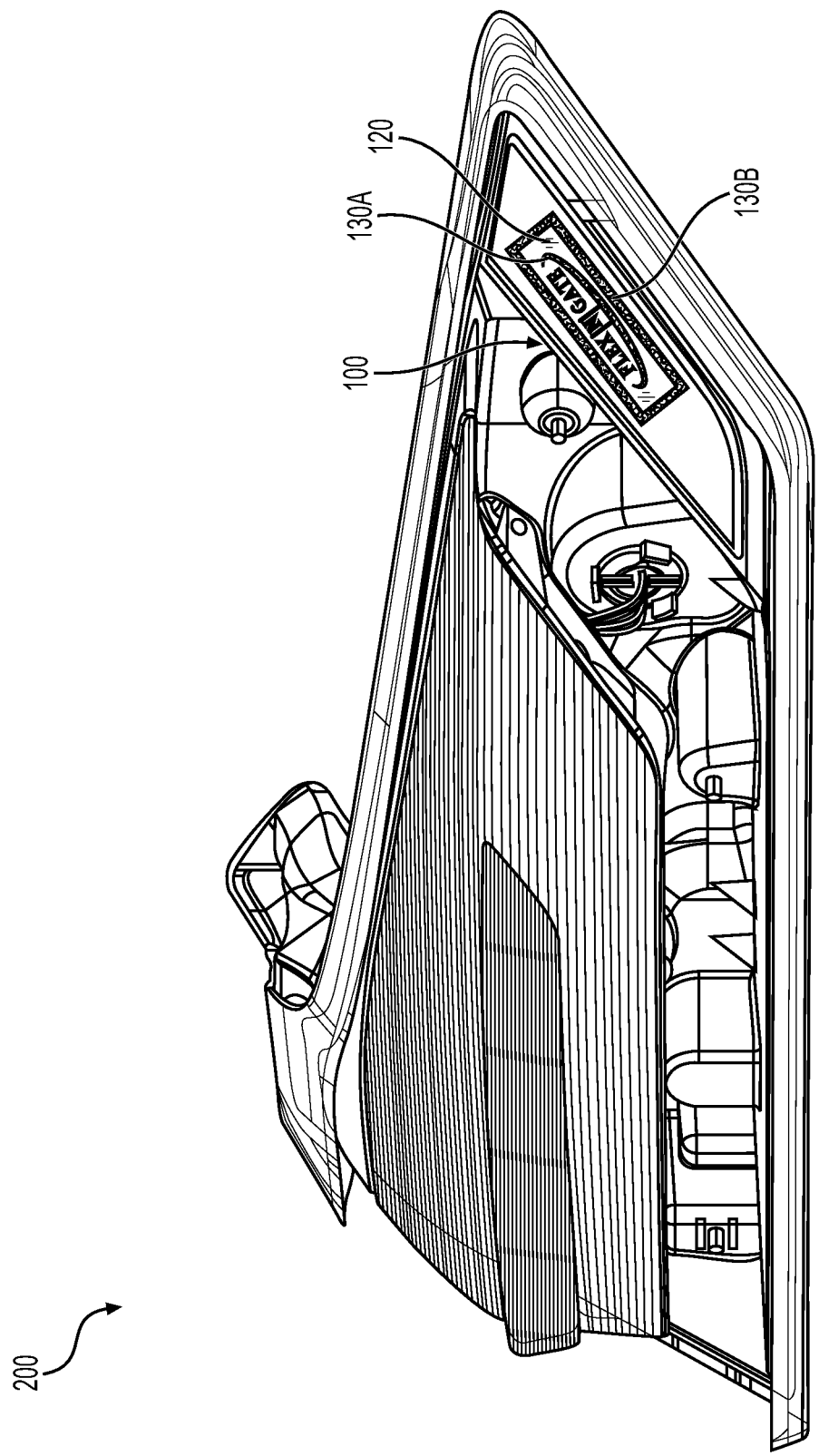
FIG. 11 depicts one embodiment of an illuminated-marking system incorporated in a vehicle taillight assembly.
Figure 12:
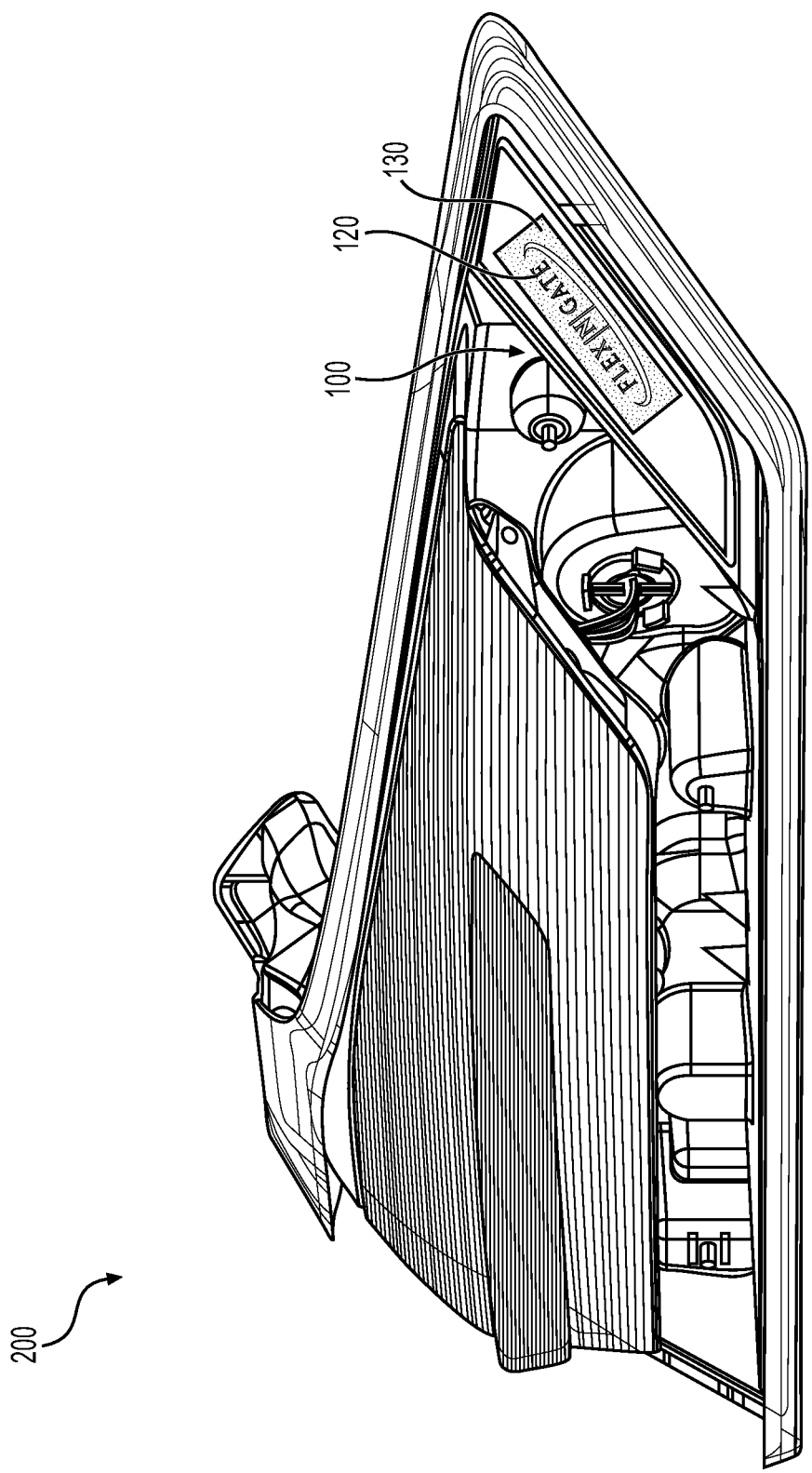
FIG. 12 depicts another embodiment of an illuminated-marking system incorporated in a vehicle taillight assembly.

FIGS. 5 through 16 depict various embodiments of illuminated-marking system 100 incorporated in a vehicle lighting assembly 200. In FIGS. 5-10, the vehicle lighting assembly 200 is an exemplary vehicle headlamp assembly. In FIGS. 11-12, the vehicle lighting assembly 200 is an exemplary vehicle taillight assembly. In FIGS. 13-16, the vehicle lighting assembly 200 is an exemplary vehicle turn-light assembly having three illuminated-marking systems 100 each incorporated on one of three light sources (e.g., a first light source 211, a second light source 212, and a third light source 213), respectively. In some embodiments, the first light source 211, second light source 212, and third light source 213 may be illuminated in a sequential manner, if, for example, a turn signal is activated. In some embodiments, one or more of the light sources 211, 212, and 213 may be progressively illuminated, such that the light source is initially dim and over time becomes sufficiently brighter. In another example, the light sources 211, 212, and 213 may be illuminated upon approach or departure of a user from the vehicle via radio frequency identification of a key fob for example.

In the embodiments of FIGS. 5, 7, 9, 11, 13, and 15, illuminated-marking system 100 includes first marking 130A, an unblocked portion 120, and border marking 130B such that the first marking 130A forms a darkened graphic or text which is surrounded by an illuminated background.

In the embodiments of FIGS. 6, 8, 10, 12, and 16, illuminated-marking system 100 includes a marking 130 that forms a darkened background and unblocked portion 120 forms the illuminated graphic or text.

Figure 13:
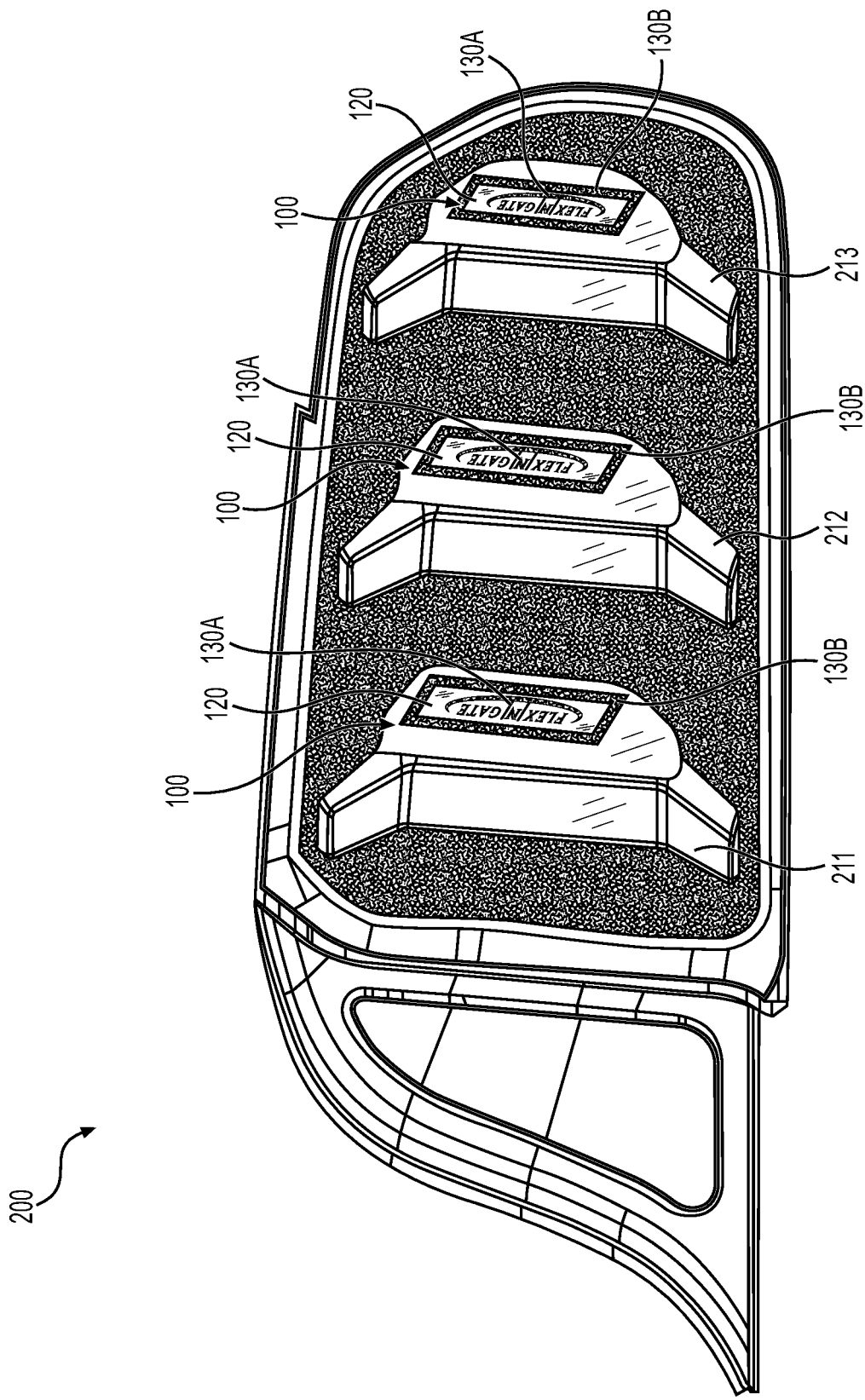
FIG. 13 depicts one embodiment having three illuminated-marking systems incorporated in a vehicle tail-light assembly.
Figure 14:
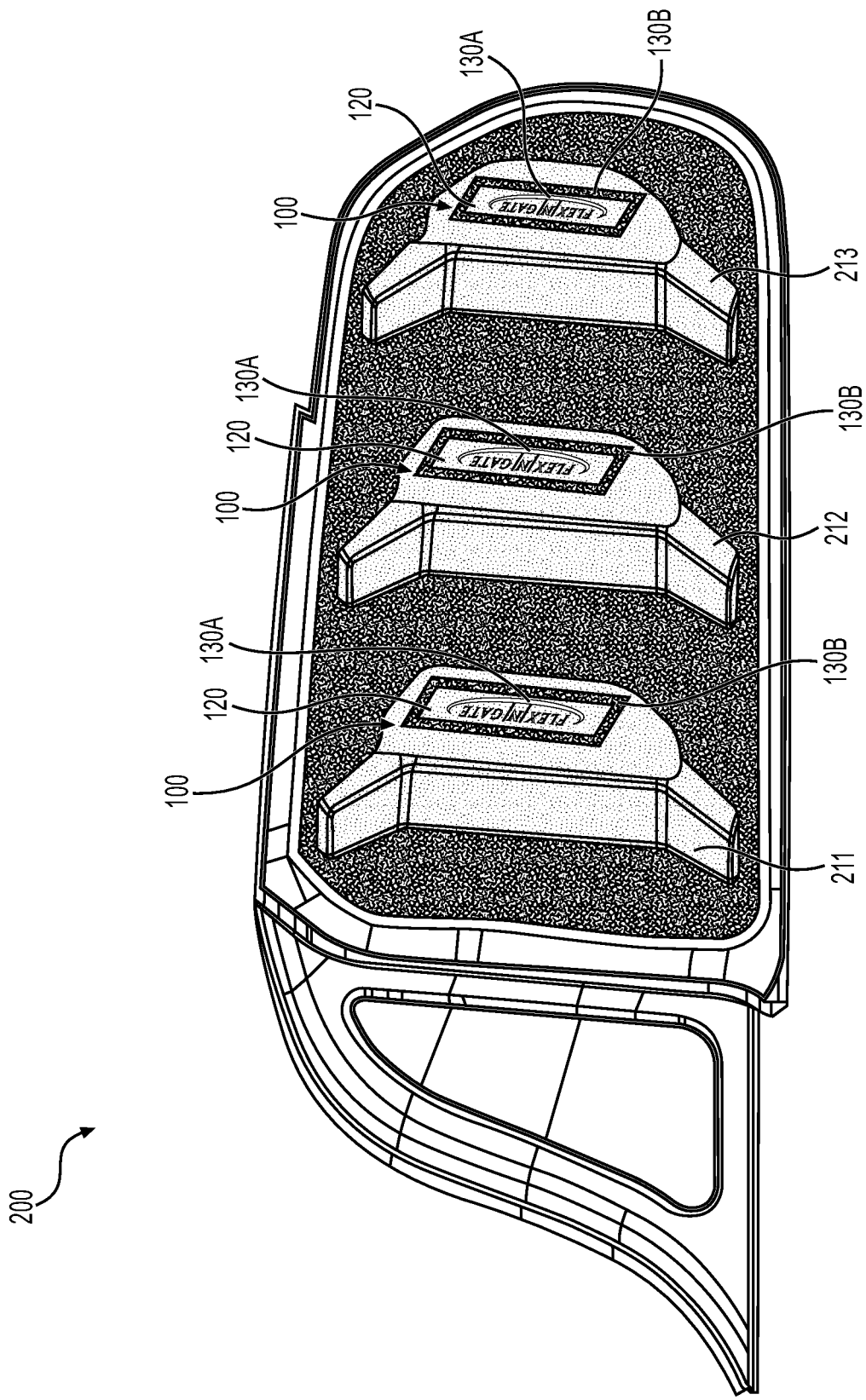
FIG. 14 depicts another embodiment having three illuminated-marking systems incorporated in a vehicle tail-light assembly.
Figure 15:
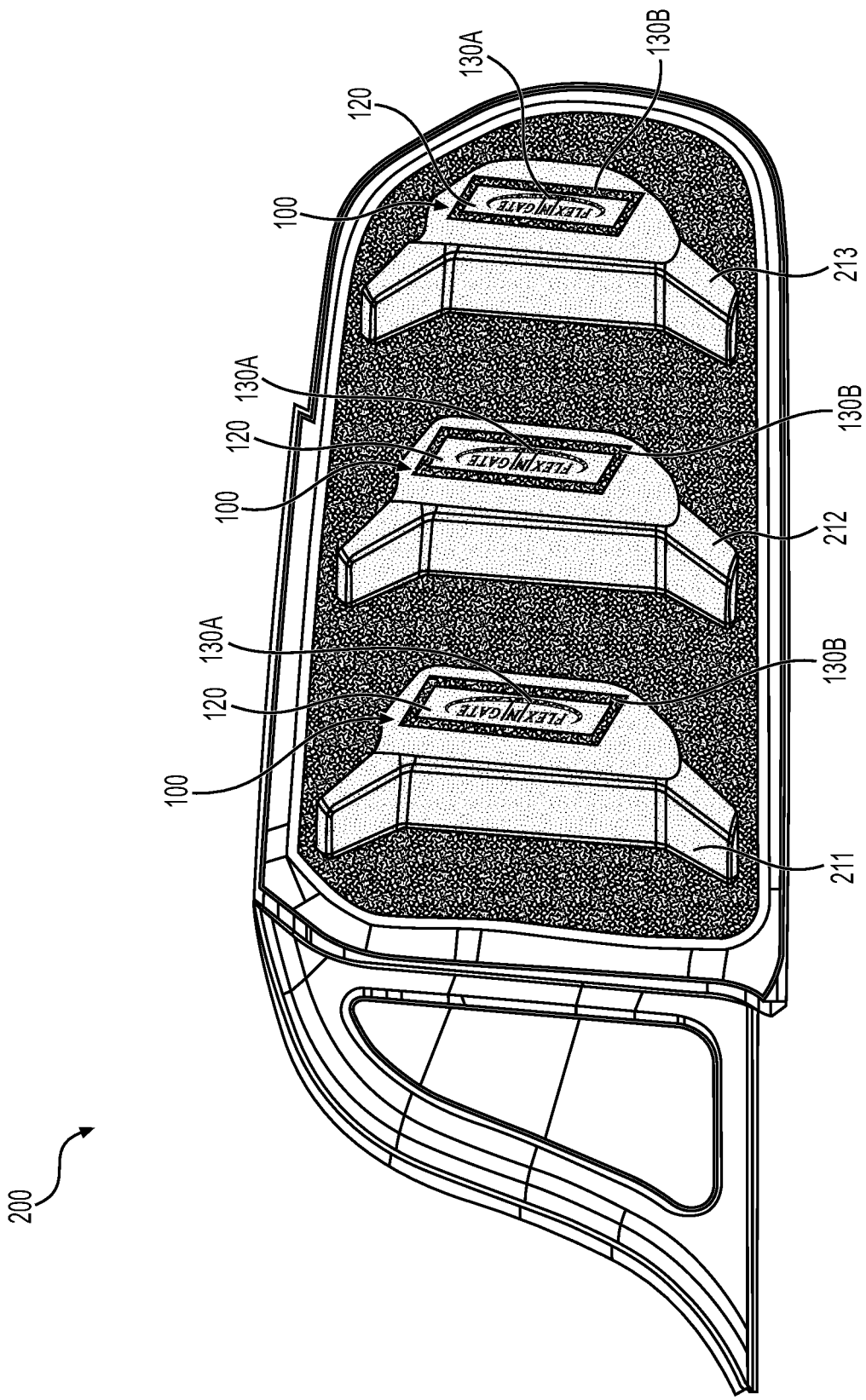
FIG. 15 depicts another embodiment having three illuminated-marking systems incorporated in a vehicle tail-light assembly.
Figure 16:
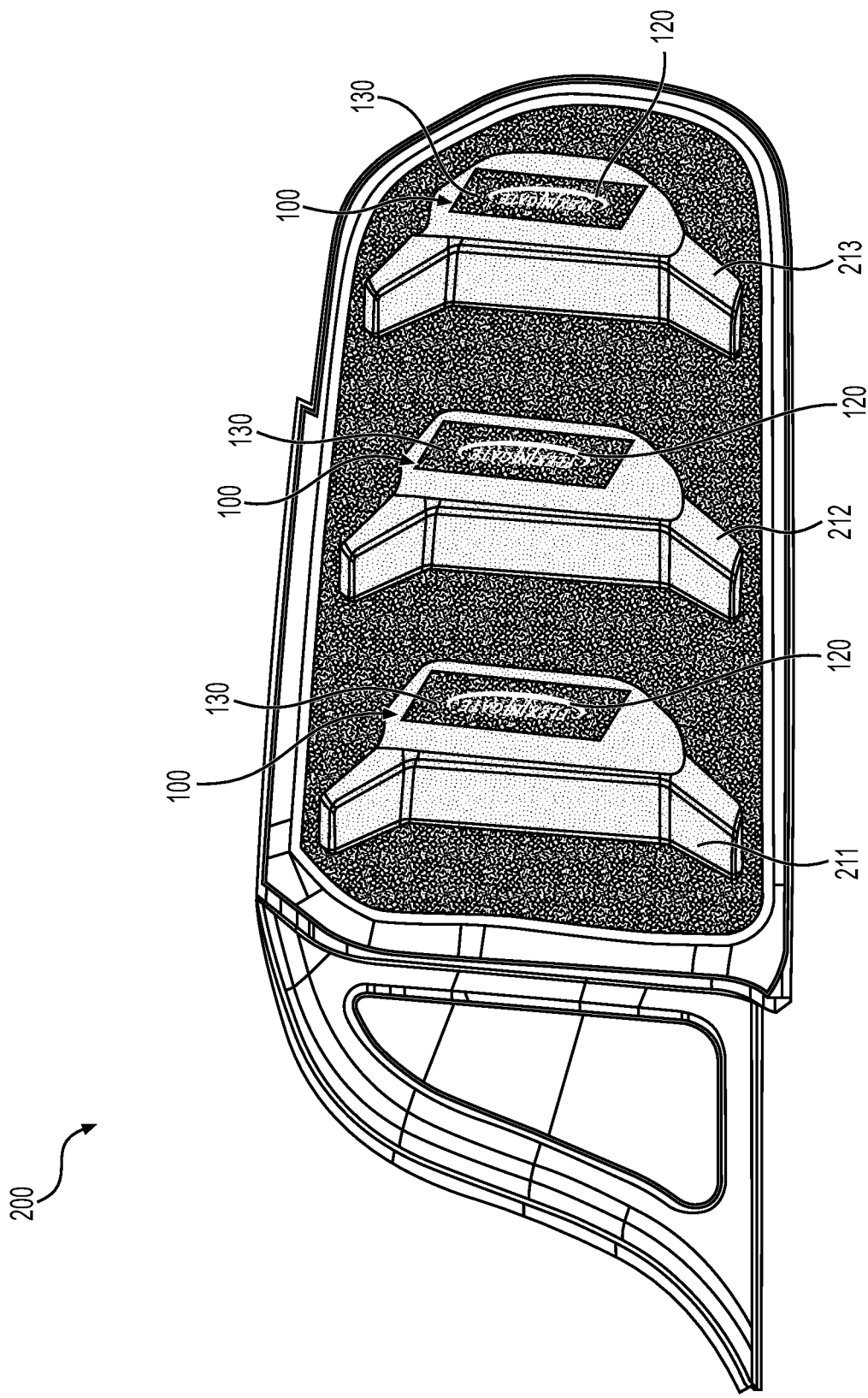
FIG. 16 depicts another embodiment having three illuminated-marking systems incorporated in a vehicle tail-light assembly.

In FIG. 13, first light source 211, second light source 212, and third light source 213 are in the lit state (i.e., illuminated), whereas in FIGS. 14-16, first, second, and third light sources 211-213 are in the unlit state (e.g., turned off).

In the embodiment of FIG. 14, illuminated-marking system 100 includes first marking 130A that forms a darkened outline of a graphic, border marking 130B that forms a darkened outline of the illuminated-marking system 100, and unblocked portions 120 which provide an illuminated background and an illuminated interior portion of the graphic. In the embodiment of FIG. 15, illuminated-marking system 100 includes first marking 130A that forms a substantially darkened graphic, border marking 130B that forms a darkened outline of the illuminated-marking system 100, and unblocked portions 120 which provide an illuminated background. In the embodiment of FIG. 16, illuminated-marking system 100 includes a marking 130 that forms a substantially darkened portion, wherein the unblocked portions 120 define the graphic. Of course, many different types of graphics and text are envisioned for use in the markings, beyond what are presented herein, since the purpose of the illuminated-marking system 100 is to provide custom markings for different vehicles using standard OLED panels.

It should be understood that the concepts described herein may apply not only to lighting assemblies used in vehicles, but also to lighting assemblies not used in vehicles (e.g., signs, streetlights, flashlights, building interior and exterior lamps, machinery, medical devices, and other consumer products where lighting assemblies are used).

Features described above as well as those claimed below may be combined in various ways without departing from the scope hereof. The following examples illustrate some possible, non-limiting combinations:

(A1) An illuminated-marking system includes an OLED panel integrated within a lighting assembly and a custom marking disposed on a surface of the OLED panel for blocking a portion of light emitted from the OLED panel such that a custom illuminated marking is provided within the exterior of the lighting assembly.

(A2) For the illuminated-marking system denoted as (A1), the custom marking may be an ink composition.

(A3) For the illuminated-marking system denoted as (A1) or (A2), the ink composition may be printed directly onto the OLED panel.

(A4) For the illuminated-marking system denoted as any of (A1) through (A3), the custom marking may include a first marking having a blocked portion and an unblocked portion for substantially blocking light and allowing light to pass, respectively, thereby forming an illuminated emblem.

(A5) For the illuminated-marking system denoted as any of (A1) through (A4), the custom marking may include a border marking disposed on the OLED panel adjacent the first marking.

(A6) For the illuminated-marking system denoted as any of (A1) through (A5), the blocked portion of the first marking may be configured to partially block light thereby forming a semi-opaque emblem.

(A7) For the illuminated-marking system denoted as any of (A1) through (A6), the custom marking may include one or more layers of the ink composition.

(A8) For the illuminated-marking system denoted as any of (A1) through (A7), the OLED panel may include a backing that increases the efficiency of the light emitted by the OLED panel.

(A9) For the illuminated-marking system denoted as any of (A1) through (A8), the lighting assembly may be one of a vehicular lighting assembly.

(B1) An illuminated-marking system in a vehicle lighting assembly includes an OLED panel integrated within the vehicle lighting assembly and a first marking which alters light exiting the OLED panel and is printed onto the OLED panel.

(B2) For the illuminated-marking system denoted as (B1), the first marking may be an ink composition.

(B3) For the illuminated-marking system denoted as (B1) or (B2), the first marking may allow light to pass through a first portion thereby forming an illuminated emblem.

(B4) For the illuminated-marking system denoted as any of (B1) through (B3), the first marking may block light at a first portion thereby forming an opaque emblem.

(B5) For the illuminated-marking system denoted as any of (B1) through (B4), may include a border marking which may be printed onto the OLED panel adjacent the first marking.

(B6) For the illuminated-marking system denoted as any of (B1) through (B5), the OLED panel may include a backing that increases the efficiency of the light emitted from the OLED panel.

(C1) A process for producing an illuminated-marking system in a vehicle lighting assembly, includes: mixing one or more inks to form a desired ink composition, printing one or more desired ink compositions onto an OLED panel, curing the one or more desired ink compositions on the OLED panel to form the illuminated-marking system, and integrating the illuminated-marking system within the vehicle lighting assembly which includes operatively connecting the illuminated-marking system to a controller within a vehicle.

(C2) For the process denoted as (C1), an adhesion promotor may be printed onto the OLED panel prior to printing the one or more desired ink compositions.

(C3) For the process denoted as (C1) or (C2), curing the one or more desired ink compositions on the OLED panel may include exposing the one or more desired ink compositions to ultraviolet light.

(C4) For the process denoted as any of (C1) through (C3), the mixing of one or more inks forms a desired ink composition that may be substantially opaque.

(C5) For the process denoted as any of (C1) through (C4), the mixing of one or more inks forms a desired ink composition that may be substantially translucent.

Many different arrangements of the various components depicted, as well as components not shown, are possible without departing from the spirit and scope of what is claimed herein. Embodiments have been described with the intent to be illustrative rather than restrictive. Alternative embodiments will become apparent to those skilled in the art that do not depart from what is disclosed. A skilled artisan may develop alternative means of implementing the aforementioned improvements without departing from what is claimed.

It will be understood that certain features and subcombinations are of utility and may be employed without reference to other features and subcombinations and are contemplated within the scope of the claims. Not all operations listed in the various figures need be carried out in the specific order described.

The invention claimed is:

1. An illuminated-marking system comprising:
an OLED panel integrated within a lighting assembly; and
a custom marking comprising an ink composition printed directly on a surface of the OLED panel for blocking a portion of light emitted from the OLED panel such that a custom illuminated marking is provided within the exterior of the lighting assembly.

2. The illuminated-marking system of claim 1, wherein the custom marking comprises a first marking having a blocked portion and an unblocked portion for substantially blocking light and allowing light to pass, respectively, thereby forming an illuminated emblem.

3. The illuminated-marking system of claim 2, wherein the custom marking further comprises a border marking disposed on the OLED panel adjacent the first marking.

4. The illuminated-marking system of claim 2, wherein the blocked portion of the first marking is configured to partially block light thereby forming a semi-opaque emblem.

5. The illuminated-marking system of claim 1, wherein the custom marking comprises one or more layers of the ink composition.

6. The illuminated-marking system of claim 1, wherein the OLED panel comprises a backing that increases the efficiency of the light emitted by the OLED panel.

7. The illuminated-marking system of claim 1, wherein the lighting assembly is one of a vehicular lighting assembly.

8. An illuminated-marking system in a vehicle lighting assembly, the illuminated-marking system comprising:
an OLED panel,
wherein the OLED panel is integrated within the vehicle lighting assembly;
a first marking,
wherein the first marking alters light exiting the OLED panel, and
wherein the first marking is disposed onto the OLED panel; and
a second marking having a different composition than the first marking,
wherein the second marking is disposed directly on at least a portion of the first marking.

9. The illuminated-marking system of claim 8, wherein the first marking comprises an ink composition.

10. The illuminated-marking system of claim 8, wherein the first marking allows light to pass through a first portion thereby forming an illuminated emblem.

11. The illuminated-marking system of claim 8, wherein the first marking blocks light at a first portion thereby forming an opaque emblem.

12. The illuminated-marking system of claim 8, further comprising a border marking printed onto the OLED panel adjacent the first marking.

13. The illuminated-marking system of claim 8, wherein the OLED panel comprises a backing that increases the efficiency of the light emitted from the OLED panel.

14. The illuminated-marking system of claim 8, wherein the second marking comprises an ink composition having different properties than the ink composition of the first marking.

15. The illuminated-marking system of claim 14, wherein the second marking comprises one or more printed decals such that the one or more printed decals of the second marking are layered on top of the one or more printed decals of the first marking to create an image set.

16. The illuminated-marking system of claim 8, wherein the first marking comprises one or more printed decals.

* * * * *